(12) United States Patent
Xiang (10) Patent No.: US 9,240,697 B2
(45) Date of Patent: Jan. 19, 2016

(54) CHARGING CIRCUIT AND METHOD FOR PREVENTING CHARGING POWER SUPPLY FROM REVERSELY CONNECTING

(71) Applicant: Zhiyong Xiang, Shenzhen (CN)

(72) Inventor: Zhiyong Xiang, Shenzhen (CN)

(73) Assignee: HUIZHOU KIMREE TECHNOLOGY CO., LTD. SHENZHEN BRANCH, Shenzhen (CN)

( * ) Notice: Subject to any disclaimer, the term of this patent is extended or adjusted under 35 U.S.C. 154(b) by 223 days.

(21) Appl. No.: 13/968,159

(22) Filed: Aug. 15, 2013

(65) Prior Publication Data

US 2014/0354215 A1    Dec. 4, 2014

(30) Foreign Application Priority Data

May 29, 2013    (CN) .......................... 2013 1 0207232

(51) Int. Cl.
| | |
|---|---|
| *H02J 7/04* | (2006.01) |
| *H02J 7/06* | (2006.01) |
| *H02J 7/16* | (2006.01) |
| *H02J 7/24* | (2006.01) |
| *H01H 50/54* | (2006.01) |
| *H02H 11/00* | (2006.01) |
| *H02J 7/00* | (2006.01) |
| *G01R 19/14* | (2006.01) |

(52) U.S. Cl.
CPC .............. *H02J 7/0052* (2013.01); *G01R 19/14* (2013.01); *H01H 50/54* (2013.01); *H02H 11/00* (2013.01); *H02J 7/04* (2013.01); *H02J 7/06* (2013.01); *H02J 7/16* (2013.01); *H02J 7/24* (2013.01)

(58) Field of Classification Search
CPC ................. H02J 7/00; H02J 7/04; H02J 7/06; H02J 7/16; H02J 7/24; G01R 19/14; H01H 50/54; H02H 11/00
USPC ......... 320/107, 114, 136, 149, 152, 158, 159, 320/164, 165; 324/133; 361/245, 246
See application file for complete search history.

(56) References Cited

U.S. PATENT DOCUMENTS

| | | | | |
|---|---|---|---|---|
| 4,820,965 | A * | 4/1989 | Siemer ........................... | 320/165 |
| 5,523,669 | A * | 6/1996 | Oku et al. ...................... | 320/160 |
| 5,532,524 | A * | 7/1996 | Townsley et al. ............... | 307/64 |
| 5,726,505 | A * | 3/1998 | Yamada et al. ................ | 307/127 |
| 6,229,723 | B1 * | 5/2001 | Umetsu et al. ................. | 363/71 |
| 6,433,667 | B1 * | 8/2002 | Isomichi ........................ | 340/7.2 |
| 7,126,296 | B1 * | 10/2006 | Burlak et al. .................. | 318/280 |
| 7,453,268 | B2 * | 11/2008 | Lin ................................. | 324/608 |
| 2001/0048286 | A1* | 12/2001 | Tanaka et al. .................. | 320/116 |
| 2004/0189261 | A1* | 9/2004 | Hauenstein et al. ........... | 320/165 |

(Continued)

*Primary Examiner* — Phallaka Kik
(74) *Attorney, Agent, or Firm* — Tim Tingkang Xia, Esq.; Locke Lord LLP (57) ABSTRACT

The invention discloses a charging circuit and a method for preventing charging power supply from reversely connecting in an electronic cigarette or electronic cigarette case. The charging circuit comprises a direct current input terminal, an unit for preventing charging power supply from reversely connecting, a charge management unit and a rechargeable battery. The unit is electrically connected to the direct current input terminal; the charge management unit is electrically connected to the unit and the rechargeable battery. The charging circuit and method according to these embodiments of the invention can effectively avoid the risk caused by the reverse connection of the charging power supply for the electronic cigarette or the electronic cigarette case; it also has the advantages such as low voltage drop and low power consumption.

12 Claims, 7 Drawing Sheets

(56) References Cited

U.S. PATENT DOCUMENTS

| | | | |
|---|---|---|---|
| 2005/0253458 A1* | 11/2005 | Omae et al. | 307/10.1 |
| 2007/0081285 A1* | 4/2007 | Takeshita et al. | 361/84 |
| 2008/0197815 A1* | 8/2008 | Liebstueckel et al. | 322/5 |
| 2009/0322161 A1* | 12/2009 | Patel | 307/131 |
| 2011/0232143 A1* | 9/2011 | Hsu | 40/570 |
| 2014/0125284 A1* | 5/2014 | Qahouq | 320/118 |

* cited by examiner

CHARGING CIRCUIT AND METHOD FOR PREVENTING CHARGING POWER SUPPLY FROM REVERSELY CONNECTING

CROSS-REFERENCE TO RELATED APPLICATIONS

This non-provisional application claims priority under 35 U.S.C. §119(a) on Patent Application No. 201310207232.X filed in P.R. China on May 29, 2013, the entire contents of which are hereby incorporated by reference.

FIELD OF THE INVENTION

The present invention relates to the technical field of electronic cigarettes, and more particularly, relates to a charging circuit and method for preventing charging power supply from reversely connecting.

BACKGROUND OF THE UTILITY MODEL

At present, a rechargeable electronic cigarette and an electronic cigarette case for charging contained electronic cigarette are not provided with a circuit for preventing a charging power supply from reversely connecting. If there were no circuit for preventing a charging power supply from reversely connecting, it would face a risk while the electronic cigarette or the electronic cigarette case is charged by the charging power supply through an adapter. Now, there is no uniform criterion for the adapter. The core heads of some adapters are anode, and the core heads of other adapters are cathode. If the core head of the adapter charging the electronic cigarette or the electronic cigarette case is cathode, it would damage charging circuit and battery, and cause short-circuit, explosion, even fire accident and so on.

SUMMARY OF THE INVENTION

Aiming at the drawbacks in the prior art that the charging circuit of the electronic cigarette and electronic cigarette case are not provided with a circuit for preventing the charging power supply from reversely connecting, a charging circuit and a method for preventing charging power supply from reversely connecting are provided according to the present invention.

A charging circuit for preventing charging power supply from reversely connecting is applied in an electronic cigarette or electronic cigarette case. The charging circuit comprises:
  a direct current input terminal;
  an unit for preventing charging power supply from reversely connecting, electrically connected to the direct current input terminal;
  a charge management unit electrically connected to the unit for preventing charging power supply from reversely connecting; and
  a rechargeable battery electrically connected to the charge management unit.

The direct current input terminal is configured to receive an input direct current from the charging power supply.

The unit for preventing charging power supply from reversely connecting is configured to prevent the direct current input terminal from supplying a reverse direct current for the rechargeable battery. When the direct current input terminal is supplied a reverse direct current, the unit for preventing charging power supply from reversely connecting cut off the reverse direct current to the rechargeable battery. When the direct current input terminal is supplied a normal direct current, the unit for preventing charging power supply from reversely connecting connects the normal direct current from the direct current input terminal to the charge management unit.

The charge management unit is configured to detect charge voltage value and charge current value when the unit for preventing charging power supply from reversely connecting turns on, and the charge management unit is also configured to control and turn on or off the charge voltage to the rechargeable battery according to detection result.

Preferably the unit for preventing charging power supply from reversely connecting comprises a first MOSFET. The first MOSFET is a P channel MOSFET, the drain of the first MOSFET is connected to the anode of the direct current input terminal, the source of the first MOSFET is connected to the charge management unit, the gate of the first MOSFET is connected to the cathode of the direct current input terminal and the rechargeable battery.

Preferably, the charge management unit comprises a voltage regulating unit, a control unit and a detection unit. Wherein the voltage regulating unit is connected to the control unit, the unit for preventing charging power supply from reversely connecting and the rechargeable battery respectively; the control unit is connected to the detection unit; the detection unit is connected to the rechargeable battery and the voltage regulating unit.

When the unit for preventing charging power supply from reversely connecting turns on, the detection unit detects the charge voltage value and charge current value. The control unit controls the voltage regulating unit turning on or off the charge voltage to the rechargeable battery, and further controls the voltage regulating unit adjusting the charged voltage to the rechargeable battery according to the detected charge voltage and current values.

Preferably, the control unit includes a microcontroller, wherein the microcontroller comprises a $V_{DD}$ terminal, a $V_{SS}$ terminal, a pulse signal output terminal, a first input terminal and a second input terminal.

The voltage regulating unit includes a first triode, a second triode, a first resistance, a second resistance, a third resistance, a first inductance, a first capacitance and fly-wheel diode.

The detection unit includes a forth resistance, a fifth resistance and a sixth resistance.

The $V_{DD}$ terminal of the microcontroller is connected to the source of the first MOSFET and the emitter of the second triode, the $V_{SS}$ terminal is connected to the ground. The base of the first triode is connected to the pulse signal output terminal through the first resistance, the emitter of the first triode is connected to the ground, the collector of the first triode is connected to the base of the second triode through the third resistance. The collector of the first triode is further connected to the emitter of the second triode and the source of the first MOSFET through the third resistance and second resistance that are connected in series.

Wherein the emitter of the second triode is connected to the source of the first MOSFET; the collector of the second triode is connected to the cathode of the fly-wheel diode and further coupled with anode of the rechargeable battery through the first inductance. The anode of the fly-wheel diode is connected to the ground; one end of the first capacitance is connected to one end of the first inductance and the anode of the rechargeable battery, the other end of the first capacitance is connected to the ground;
  wherein, one end of the forth resistance is connected to one end of the first inductance and the anode of the rechargeable battery, and the other end of the forth resistance is connected to the fifth resistance and the first input terminal of the microcontroller;

wherein, one end of the fifth resistance is connected to the forth resistance and the first input terminal of the microcontroller, and the other end is connected to the ground;

wherein, one end of the sixth resistance is connected to the second input terminal of the microcontroller and the cathode of the rechargeable battery, and the other end is connected with the ground.

Preferably, the charging circuit further includes: a reminding circuit for reverse connection electrically connected with the direct current input, which is configured to output reminding message when the direct current input terminal inputs the reverse direct current.

Preferably, the reminding circuit for reversal connection includes a light emitting diode, a current limiting resistance and a first diode;

wherein, the cathode of the light emitting diode is connected to the anode of the direct current input terminal, and the anode of the light emitting diode (D3) is connected to the cathode of the first diode through the current limiting resistance; wherein the anode of the first diode is connected to the cathode of the direct current input terminal.

Preferably, the reminding circuit for reversal connection further includes a buzzer; wherein one end of the buzzer is connected to one end of the current limiting resistance and the cathode of the first diode, the other end is connected to the anode of the direct current input terminal and the cathode of the light emitting diode.

Preferably, the unit for preventing charging power supply from reversely connecting comprises a second MOSFET, wherein the second MOSFET is a N channel MOSFET. The drain of the second MOSFET is connected to the cathode of the direct current input terminal. The source of the second MOSFET is connected to the cathode of the rechargeable battery through the sixth resistance, and the gate of the second MOSFET is connected to the anode of the direct current input terminal as well as the charge management unit.

Preferably, the charge management unit includes: a voltage regulating unit a control unit and a detection unit. Wherein the voltage regulating unit is connected to the control unit, the unit for preventing charging power supply from reversely connecting and the rechargeable battery respectively; the control unit is connected to the detection unit; the detection unit is connected to the rechargeable battery and the voltage regulating unit.

When the unit for preventing charging power supply from reversely connecting turns on, the detection unit detects the charged voltage value and charged current value, the control unit controls the voltage regulating unit turning on or off the charge voltage and further adjusting the charged voltage to the charging battery according to the detected values.

Preferably, the control unit includes a microcontroller, wherein the microcontroller comprises a $V_{DD}$ terminal, a $V_{SS}$ terminal, a pulse signal output terminal, a first input terminal and a second input terminal.

Wherein the voltage regulating unit includes a first triode, a second triode, a first resistance, a second resistance, a third resistance a first inductance, a first capacitance and fly-wheel diode.

Wherein the detection unit includes a forth resistance, a fifth resistance and a sixth resistance.

Wherein the $V_{DD}$ terminal of the microcontroller is connected to the source of the first MOSFET and the emitter of the second triode; the $V_{SS}$ terminal is connected to the ground. The base of the first triode is connected to the pulse signal output terminal through the first resistance. The emitter of the first triode is connected to the ground. The collector of the first triode is connected to the base of the second triode through the third resistance and further connected with the emitter of the second triode and the source of the first MOSFET through the third resistance and second resistance that are connected in series.

Wherein the emitter of the second triode is connected to the gate of the second MOSFET; the collector of the second triode is connected to the cathode of the fly-wheel diode and further connected with anode of the rechargeable battery through the first inductance. the anode of the fly-wheel diode is connected to the ground; one end of the first capacitance is connected to one end of the first inductance and the anode of the rechargeable battery, the other end of the first capacitance is connected to the ground.

Wherein one end of the forth resistance is connected to one end of the first inductance and the anode of the rechargeable battery, and the other end is connected to the fifth resistance and the first input terminal of the microcontroller;

Wherein one end of the fifth resistance is connected to the forth resistance and the first input terminal of the microcontroller, and the other end of the fifth resistance is connected to the ground;

Wherein one end of the sixth resistance is connected to the second input terminal of the microcontroller and the cathode of the rechargeable battery, and the other end is connected with the ground.

Preferably, the charging circuit further includes: a reminding circuit for reversal connection electrically connected with the direct current input, which is configured to output reminding message when the direct current input terminal inputs the reverse direct current.

Preferably, the reminding circuit for reversal connection includes a light emitting diode, a current limiting resistance and a first diode;

wherein, the cathode of the light emitting diode is connected to the anode of the direct current input terminal, and the anode of the light emitting diode is connected to the cathode of the first diode through the current limiting resistance; wherein the anode of the first diode is connected to the cathode of the direct current input terminal.

Preferably, the reminding circuit for reversal connection further includes a buzzer; wherein one end of the buzzer is connected to one end of the current limiting resistance and the cathode of the first diode, the other end is connected to the anode of the direct current input terminal and the cathode of the light emitting diode.

A method for preventing a reversal connection for charging power supply applied in an electronic cigarette or electronic cigarette case comprising a rechargeable battery, wherein comprising:

Receiving direct current from a charging power supply;

detecting whether the direct current is inputted normally or not;

cutting off the charging power supply if the direct current is inputted reversely;

detecting charge voltage and charge current to a rechargeable battery if the direct current is inputted normally;

turning on or off the charge voltage and adjusting the charge voltage to the rechargeable battery according to the detected values.

Preferably, the method for preventing a reversal connection for charging power supply further includes:

outputting the reminding message while the direct current is inputted reversely; wherein the reminding message includes sound alarming and/or light alarming.

When implementing the invention, the following advantages can be achieved: it can effectively prevent the risk of the electronic cigarette or the electronic cigarette case caused by the reverse connection of the charging power supply; it also has the advantages such as low voltage drop and low power consumption.

BRIEF DESCRIPTION OF THE DRAWINGS

The present invention can be further illustrated by reading the example with references made to the accompanying drawings, in which.

DETAILED DESCRIPTION OF THE PREFERRED EMBODIMENT

For recognizing the technique character, the object and the effect more clearly, the special implement of the invention is illustrated in detail with references to the accompanying drawings.

A charging circuit and method for preventing charging power supply from reversely connecting according to an embodiment of the present invention are applied in an electronic cigarette or an electronic cigarette case to prevent their charging power supply from reversely connecting. In the embodiment of the present invention, it used a MOSFET to prevent the charging power supply from reversely connecting. In such case, it can effectively prevent the risk of the electronic cigarette or the electronic cigarette case caused by the reverse connection of the charging power supply; it also meets the request of low voltage drop and low power consumption.

Figure 1:
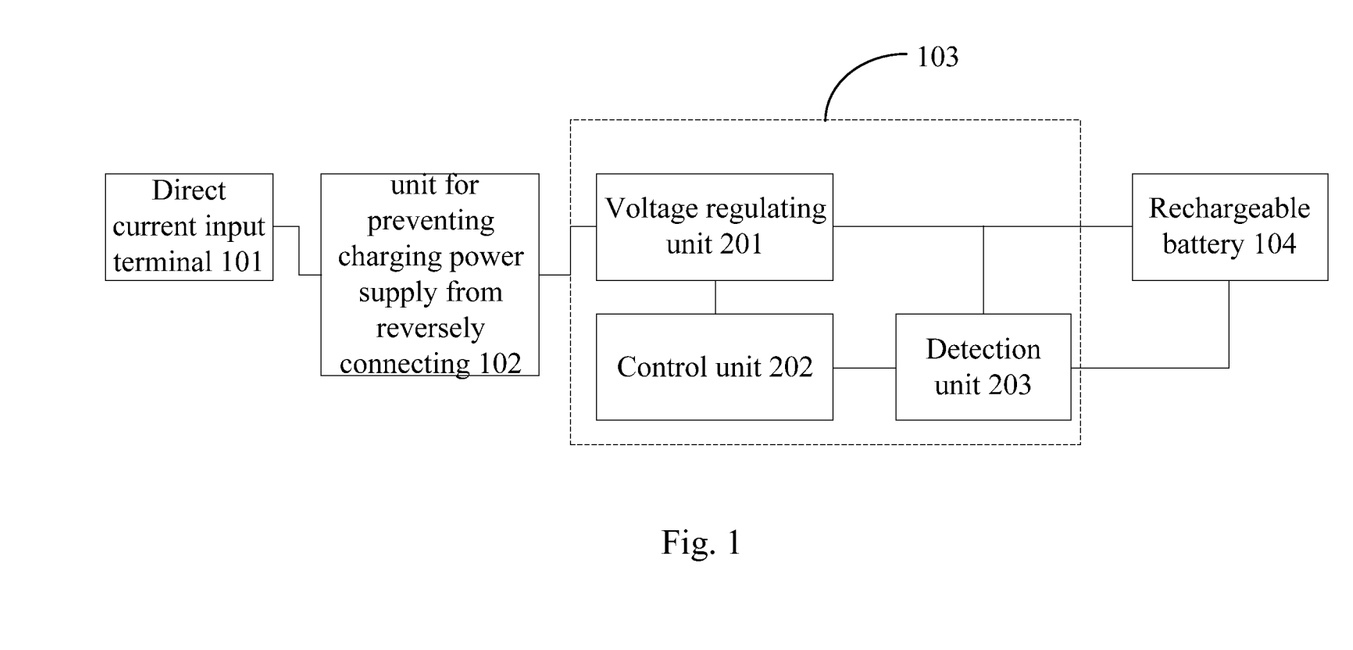
FIG. 1 is a structure diagram of a circuit for preventing charging power supply from reversely connecting according to a first embodiment of the present invention.

FIG. 1 shows a structure diagram of a circuit for preventing charging power supply from reversely connecting according to a first embodiment of the present invention. In the first embodiment, the charging circuit for preventing charging power supply from reversely connecting comprises: a direct current input terminal 101, an unit for preventing charging power supply from reversely connecting 102 electrically connected to the direct current input terminal 101, a charge management unit 103 electrically connected to the unit for preventing charging power supply from reversely connecting 102 and a rechargeable battery 104 electrically connected to the charge management unit 103.

The direct current input terminal 101 is configured to receive an input direct current from the charging power supply. Wherein the charging power supply may be power adapter and so on.

The unit for preventing charging power supply from reversely connecting 102 is configured to prevent the direct current input terminal 101 from supplying a reverse direct current to the rechargeable battery 104. Wherein when the direct current input terminal 101 supplies the reverse direct current, the unit for preventing charging power supply from reversely connecting 102 turns off so that the charging power supply to the rechargeable battery 104 is cut off. When the direct current input terminal 101 supplies a normal direct current, the unit for preventing charging power supply from reversely connecting 102 turns on and the direct current from the direct current input terminal 101 flows into the charge management unit 103 via the unit for preventing charging power supply from reversely connecting 102.

The charge management unit 103 is configured to detect charged voltage value and charged current value when the unit for preventing charging power supply from reversely connecting 102 turns on, control the charge voltage to the rechargeable battery 104, and further turns on or off the charge voltage according to detected result.

Wherein the charge management unit 103 comprises: a voltage regulating unit 201, a control unit 202 and a detection unit 203. Wherein the voltage regulating unit 201 is connected to the control unit 202, the unit for preventing charging power supply from reversely connecting 102 and the rechargeable battery 104 respectively. The control unit 202 is connected to the detection unit 203. The detection unit 203 is connected to the rechargeable battery 104 and the voltage regulating unit 201. When the unit for preventing charging power supply from reversely connecting 102 is turns on, the detection unit 203 detects the charge voltage value and charge current value. The control unit 202 controls the voltage regulating unit 201 turning on or off the charge voltage to the rechargeable battery, and further controls the voltage regulating unit 201 to adjust the charge voltage to the charging battery 104 according to the detected value.

Figure 2:
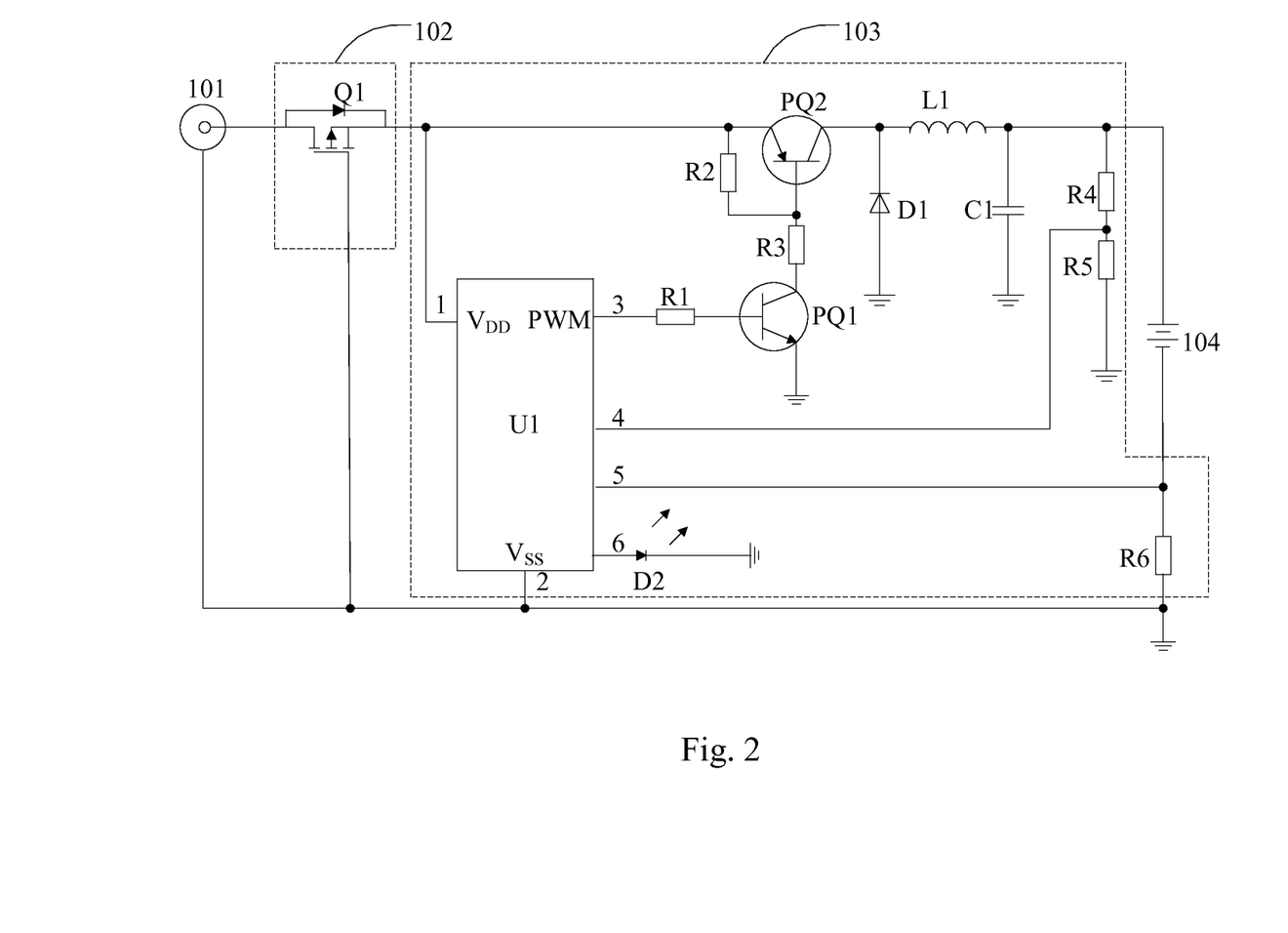
FIG. 2 is a circuit diagram of a circuit for preventing charging power supply from reversely connecting according to a first embodiment of the present invention.

As shown in FIG. 2, it is a circuit diagram of a circuit for preventing charging power supply from reversely connecting according to a first embodiment of the present invention. The charging circuit for preventing charging power supply from reversely connecting includes the direct current input terminal 101, the unit for preventing charging power supply from reversely connecting 102, the charge management unit 103 and the rechargeable battery 104. Wherein the unit for preventing charging power supply from reversely connecting 102 includes a MOSFET Q1 that is a P channel MOSFET. For example, a AO3401 MOSFET may be chosen as the MOSFET Q1. The control unit of the charge management unit 103 includes a microcontroller U1. Wherein the microcontroller U1 comprises a $V_{DD}$ terminal 1, a $V_{SS}$ terminal 2, a pulse signal output terminal 3, a first input terminal 4 and a second input terminal 5. The voltage regulating unit includes a first triode PQ1, a second triode PQ2, a first resistance R1, a second resistance R2, a third resistance R3, a first inductance L1, a first capacitance C1 and fly-wheel diode D1. The detection unit 203 includes a forth resistance R4, a fifth resistance R5 and a sixth resistance R6.

As shown in FIG. 2, the drain of the first MOSFET Q1 is connected to the anode of the direct current input terminal 101. The source of the first MOSFET Q1 is connected to the charge management unit 103. The gate of the first MOSFET Q1 is connected to the cathode of the direct current input terminal 101 and the rechargeable battery 104. The $V_{DD}$ terminal of the microcontroller U1 is connected to the source of the first MOSFET Q1 and the emitter of the second triode. The $V_{SS}$ terminal is connected to the ground. The base of the first triode PQ1 is connected to the pulse signal output terminal through the first resistance R1. The emitter of the first triode PQ1 is connected to the ground. The collector of the first triode PQ1 is connected to the base of the second triode PQ2 through the third resistance R3 and further coupled with the emitter of the second triode PQ2 and the source of the first MOSFET Q1 through the third resistance R3 and second resistance R2 that are connected in series. The emitter of the second triode PQ2 is connected to the source of the first MOSFET Q1. The collector of the second triode PQ2 is connected to the cathode of the fly-wheel diode D1 and further coupled with anode of the rechargeable battery 104 through the first inductance L1. The anode of the fly-wheel diode D1 is connected to the ground. One end of the first capacitance C1 is connected to one end of the first inductance L1 and the anode of the rechargeable battery 104. The other end of the first capacitance C1 is connected to the ground. One end of the forth resistance R4 is connected to one end of the first inductance L1 and the anode of the rechargeable battery 104, and the other end is connected to the fifth resistance R5 and the first input terminal of the microcontroller U1. One end of the fifth resistance R5 is connected to the forth resistance and the first input terminal of the microcontroller U1, and the other end is connected to the ground. One end of the sixth resistance R6 is connected to the second input terminal of the microcontroller U1 and the cathode of the rechargeable battery 104, and the other end is connected with the ground.

Reference to FIG. 2, the charge management unit 103 further includes a light emitting diode D2. The anode of the light emitting diode D2 is connected to a first output terminal 6 of the microcontroller U1, and the cathode of the light emitting diode D2 is connected to the ground.

In the first embodiment of the present invention, the drain of the MOSFET Q1 and the source of the MOSFET Q1 should be reversely connected to prevent the charging power supply from reversely connecting. The direct current input terminal 101 is connected to outer charging power supply such as the adapter.

When the outer charging power supply is connected normally, the current flows into the source of the MOSFET Q1 from the drain thereof through a parasitic diode. In such case, there is a voltage difference existed between the gate of the MOSFET Q1 and the source thereof. Thus, the MOSFET Q1 is turned on to charging the rechargeable battery 104. The MOSFET Q1 may be served as a resistance with a little resistance value while the MOSFET Q1 is turned on and the power consumption of the MOSFET Q1 is low. Therefor, the charging circuit for preventing the charging power supply from reversely connecting exhibits low power consumption and would not cause a serious heating.

When the outer charging power supply is connected reversely, the MOSFET Q1 is turned off and there is no current flowing through the drain and source of the MOSFET Q1. In such case, the outer charging power supply for the rechargeable battery is cut off.

In the first embodiment of the present invention, when the MOSFET Q1 is turned on, the charge management unit 103 detects a charged voltage value and a charged current value. The microcontroller U1 of the charge management unit 103 has functions of AD converter and pulse signal output. For example, a STC15F2K16S2 MCU or SN8P2711B MCU can be chosen. If the microcontroller U1 is a SN8P2711B MCU, the first input terminal 4 of the microcontroller U1 may be served as a third pin of the MCU, the second input terminal 5 may be served as a fifth pin of the MCU, and the pulse signal output terminal 3 may be served as a forth pin of the MCU. Moreover, because the SN8P2711B MCU has two pulse signal output terminals and six input or/and output terminals, the first input terminal 4, the second input terminal 5, the first output terminal 6 and the pulse signal output terminal 3 may be served as other pins of the MCU.

As MOSFET Q1 turning on, if a voltage value detected by the first input terminal 4 of the microcontroller U1 does not exceed a preset voltage value, or/and a current value detected by the second input terminal 5 thereof does not exceed a preset current value, the microcontroller U1 controls the pulse signal output terminal 3 output a high level. The NPN triode PQ1 and PNP triode PQ2 are turned on, and the direct current input terminal 101 can charge the rechargeable battery 104.

As MOSFET Q1 turning on, if a voltage value detected by the first input terminal 4 of the microcontroller U1 exceeds a preset voltage value, or/and a current value detected by the second input terminal 5 thereof exceeds a preset current value, the microcontroller U1 controls the pulse signal output terminal 3 to output a low level. The NPN triode PQ1 and PNP triode PQ2 are turned off, and the charging power supply to the rechargeable battery 104 is cutoff to protect the charging circuit. At the same time, the microcontroller U1 controls the first output terminal 6 to output the high level so that the light emitting diode D2 remind users by emitting light. Moreover, the light emitting diode D2 also can remind users while charge process finished.

Additionally, in the embodiment of the present invention, the microcontroller U1 controls the conductive state of the triode PQ2 whereas by means of regulating a duty cycle of the pulse signal output by the pulse signal output terminal 3 according to the detected charged voltage value and charged current value. In such case, it can regulate the charge voltage value so that the charge voltage to the rechargeable battery 104 is in a certain range.

Figure 3:
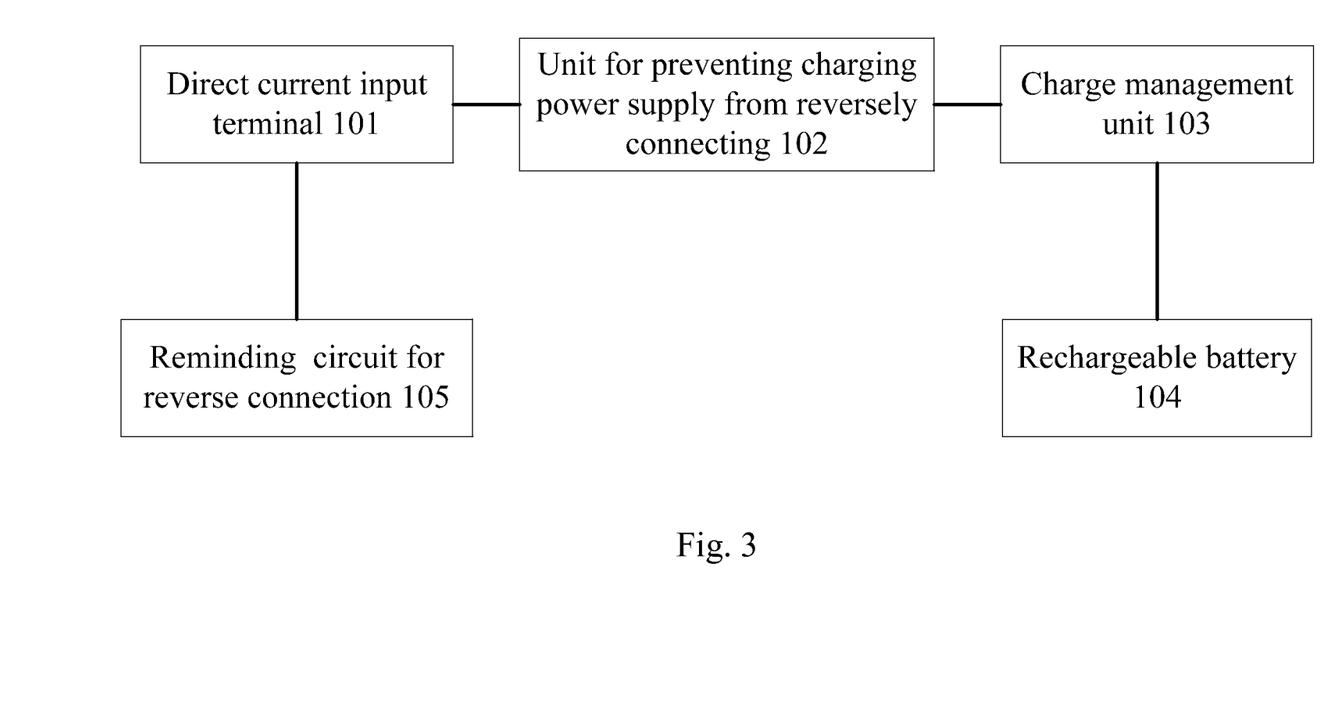
FIG. 3 is a structure diagram of a circuit for preventing charging power supply from reversely connecting according to a second embodiment of the present invention.

FIG. 3 shows a structure diagram of a circuit for preventing charging power supply from reversely connecting according to a second embodiment of the present invention. In the second embodiment of the invention, the charging circuit includes: a direct current input terminal 101, an unit for preventing charging power supply from reversely connecting 102 electrically connected with the direct current input terminal 101, a charge management unit 103 electrically connected with the unit for preventing charging power supply from reversely connecting 102, a rechargeable battery 104 electrically connected with the charge management unit 103 and a reminding circuit for reversal connection 105 electrically connected with the direct current input terminal 101. The reminding circuit for reversal connection 105 is configured to output a reminding message when the direct current input terminal 101 inputs the reverse direct current. The reminding message includes sound alarming and/or light alarming.

Figure 4:
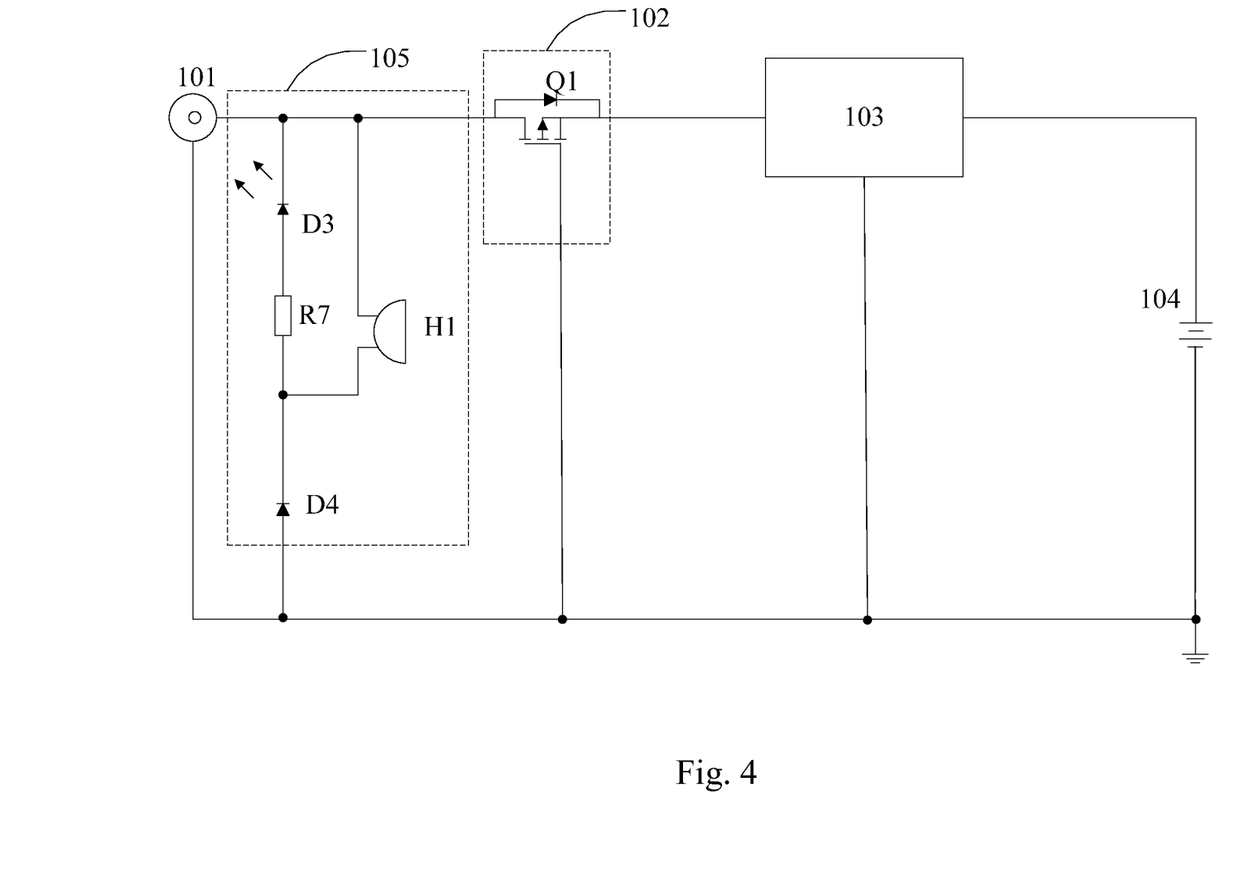
FIG. 4 is a circuit diagram of a circuit for preventing charging power supply from reversely connecting according to a second embodiment of the present invention.

As shown in FIG. 4, in the second embodiment of the invention, the unit for preventing charging power supply from reversely connecting 102 and the charge management unit 103 are the same as that in the first embodiment, and are not described again herein.

In the second embodiment, the reminding circuit for reversal connection 105 includes a light emitting diode D3, current limiting resistance R7 and a first diode D4 and a buzzer H1.

Reference to FIG. 4, the cathode of the light emitting diode D3 is connected to the anode of the direct current input terminal 101, and the anode thereof is connected to the cathode of the first diode D4 through the current limiting resistance R7. Wherein the anode of the first diode D4 is connected to the cathode of the direct current input terminal 101. One end of the buzzer H1 is connected to one end of the current limiting resistance R7 and the cathode of the first diode D4, the other end thereof is connected to the anode of the direct current input terminal 101 and the cathode of the light emitting diode D3.

In the second embodiment, when the outer charging power supply is connected normally, a diode D4 is cutoff and the light emitting diode D3 and the buzzer H1 stop working. When the outer charging power supply is connected reversely, the diode D4 is conductive and the light emitting diode D3 and the buzzer H1 work to output a reminding message.

In the second embodiment, because of adding the reminding circuit for reversal connection 105, the light emitting diode D3 and/or the buzzer H1 can remind users when the outer charging power supply is connected reversely. In such case, users can discover the problem immediately.

Figure 5:
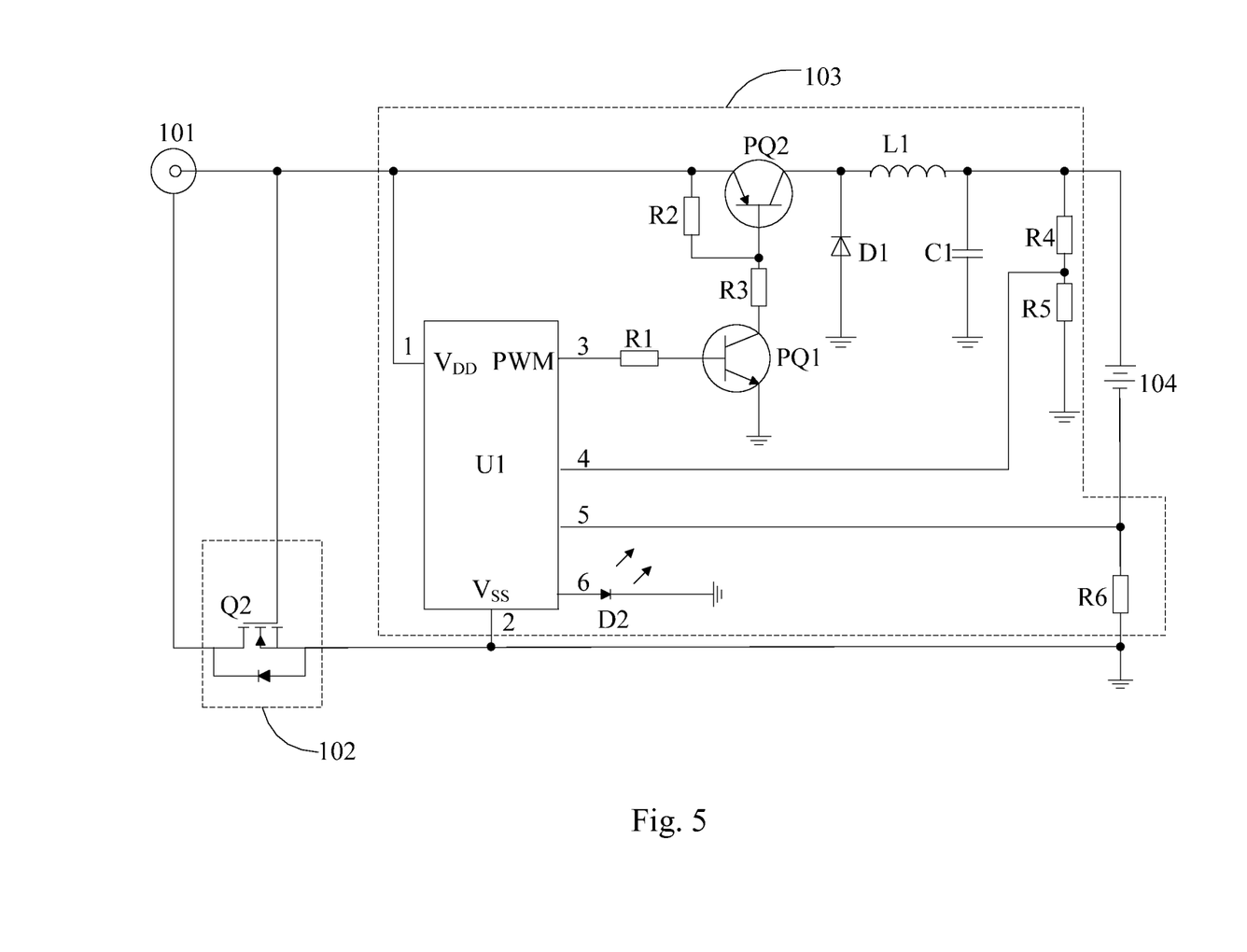
FIG. 5 is a circuit diagram of a circuit for preventing charging power supply from reversely connecting according to a third embodiment of the present invention.

FIG. 5 is circuit diagram of a circuit for preventing charging power supply from reversely connecting according to a third embodiment of the present invention. In the third embodiment, the charging circuit includes: a direct current input terminal 101, an unit for preventing charging power supply from reversely connecting 102 electrically connected with the direct current input terminal 101, a charge management unit 103 electrically connected with the unit for preventing charging power supply from reversely connecting 102 and a rechargeable battery 104 electrically connected with the charge management unit 103.

As shown in FIG. 5, in the third embodiment of the invention, the unit for preventing charging power supply from reversely connecting 102 includes a MOSFET Q2. The MOSFET Q2 is a N channel MOSFET. For example, a AO3402 MOSFET may be chosen as the MOSFET Q1.

Wherein the drain of the MOSFET Q2 is connected to the cathode of the direct current input terminal 101. The source of the MOSFET Q2 is connected to the cathode of the rechargeable battery 104 through the sixth resistance R6. The gate of the second MOSFET Q2 is connected to the anode of the direct current input terminal 101 as well as the charge management unit 103.

Reference to FIG. 5, in the third embodiment of the invention, the control unit of the charge management 103 includes a microcontroller U1. wherein the microcontroller U1 comprises a VDD terminal 1, a VSS terminal 2, a pulse signal output terminal 3, a first input terminal 4 and a second input terminal 5. wherein, the voltage regulating unit 201 includes a first triode PQ1, a second triode PQ2, a first resistance R1, a second resistance R2, a third resistance R3, a first inductance L1, a first capacitance C1 and fly-wheel diode D1. wherein the detection unit 203 includes a forth resistance R4, a resistance fifth R5 and a sixth resistance R6.

wherein the $V_{DD}$ terminal of the microcontroller U1 is connected to the gate of the second MOSFET Q2 and the emitter of the second triode. the $V_{SS}$ terminal is connected to the ground. the base of the first triode PQ1 is connected to the pulse signal output terminal of the microcontroller U1 through the first resistance R1; the emitter of the first triode PQ1 is connected to the ground; the collector of the first triode PQ1 is connected to the base of the second triode PQ2 through the third resistance R3 and further connected to the emitter of the second triode PQ2 and the gate of the second MOSFET Q2 through the third resistance R3 and second resistance R2 that are connected in series. Wherein the emitter of the second triode PQ2 is connected to the gate of the second MOSFET Q2; the collector of the second triode PQ2 is connected to the cathode of the fly-wheel diode D1 and further connected with anode of the rechargeable battery 104 through the first inductance L1; the anode of the fly-wheel diode D1 is connected to the ground; one end of the first capacitance C1 is connected to one end of the first inductance L1 and the anode of the rechargeable battery 104, the other end of the first capacitance C1 is connected to the ground. Wherein one end of the forth resistance R4 is connected to one end of the first inductance L1 and the anode of the rechargeable battery 104, and the other end is connected to the fifth resistance R5 and the first input terminal of the microcontroller U1. Wherein, one end of the fifth resistance R5 is connected to the forth resistance R4 and the first input terminal of the microcontroller U1, and the other end is connected to the ground. Wherein one end of the sixth resistance R6 is connected to the second input terminal of the microcontroller U1 and the cathode of the rechargeable battery 104, and the other end is connected with the ground.

As shown in FIG. 5, the charge management unit 103 further includes a light emitting diode D2. The anode of the light emitting diode D2 is connected to a first output terminal 6 of the microcontroller U1, and the cathode of the light emitting diode D2 is connected to the ground.

In the third embodiment of the invention, when the outer charging power supply is connected normally, the current flows into the source of the MOSFET Q2 from the drain thereof through a parasitic diode. In such case, there is a voltage difference existed between the gate of the MOSFET Q2 and the source thereof. Thus, the MOSFET Q2 is turned on to charging the rechargeable battery 104. The MOSFET Q2 may be served as a resistance with a little resistance value while the MOSFET Q2 is turned on and the power consumption of the MOSFET Q2 is low. Therefor, the charging circuit for preventing the charging power supply from reversely connecting exhibits low power consumption and would not cause a serious heating, compared with the diode for reverse connection in the prior art.

When the outer charging power supply is connected reversely, the MOSFET Q2 is turned off and there is no current following through the drain and source of the MOSFET Q2. In such case, the outer charging power supply to the rechargeable battery is cut off.

In the third embodiment of the present invention, when the MOSFET Q2 is turned on, the charge management unit 103 detects a charged voltage value and a charged current value. The microcontroller U1 of the charge management unit 103 should have functions of AD converter and pulse signal output. For example, a STC15F2K16S2 MCU or SN8P2711B MCU can be chosen. If the microcontroller U1 is a SN8P2711B MCU, the first input terminal 4 of the microcontroller U1 may be served as a third pin of the MCU, the second input terminal 5 may be served as a fifth pin of the MCU, and the pulse signal output terminal 3 may be served as a forth pin of the MCU. Moreover, because the SN8P2711B MCU has two pulse signal output terminals and six input or/and output terminals, the first input terminal 4, the second input terminal 5, the first output terminal 6 and the pulse signal output terminal 3 may be served as other pins of the MCU.

As MOSFET Q2 turning on, if a voltage value detected by the first input terminal 4 of the microcontroller U1 does not exceed a preset voltage value, or/and a current value detected by the second input terminal 5 thereof does not exceed a preset current value, the microcontroller U1 controls the pulse signal output terminal 3 output a high level. The NPN triode PQ1 and PNP triode PQ2 are turned on, and the direct current input terminal 101 can charge the rechargeable battery 104.

As MOSFET Q2 turning on, if a voltage value detected by the first input terminal 4 of the microcontroller U1 exceeds a preset voltage value, or/and a current value detected by the second input terminal 5 thereof exceeds a preset current value, the microcontroller U1 controls the pulse signal output terminal 3 to output a low level. The NPN triode PQ1 and PNP triode PQ2 are turned off, and the outer charging power supply to the rechargeable battery 104 is cutoff to protect the charging circuit. At the same time, the microcontroller U1 controls the first output terminal 6 to output the high level so that the light emitting diode D2 remind users by emitting light. Moreover, the light emitting diode D2 also can remind users while charge process finished.

Additionally, in the embodiment of the present invention, the microcontroller U1 controls the conductive state of the triode PQ2 whereas by means of regulating a duty cycle of the pulse signal output by the pulse signal output terminal 3 according to the detected charge voltage value and charge current value. In such case, it can regulate the charge voltage value so that the charge voltage to the rechargeable battery 104 is in a certain range.

Figure 6:
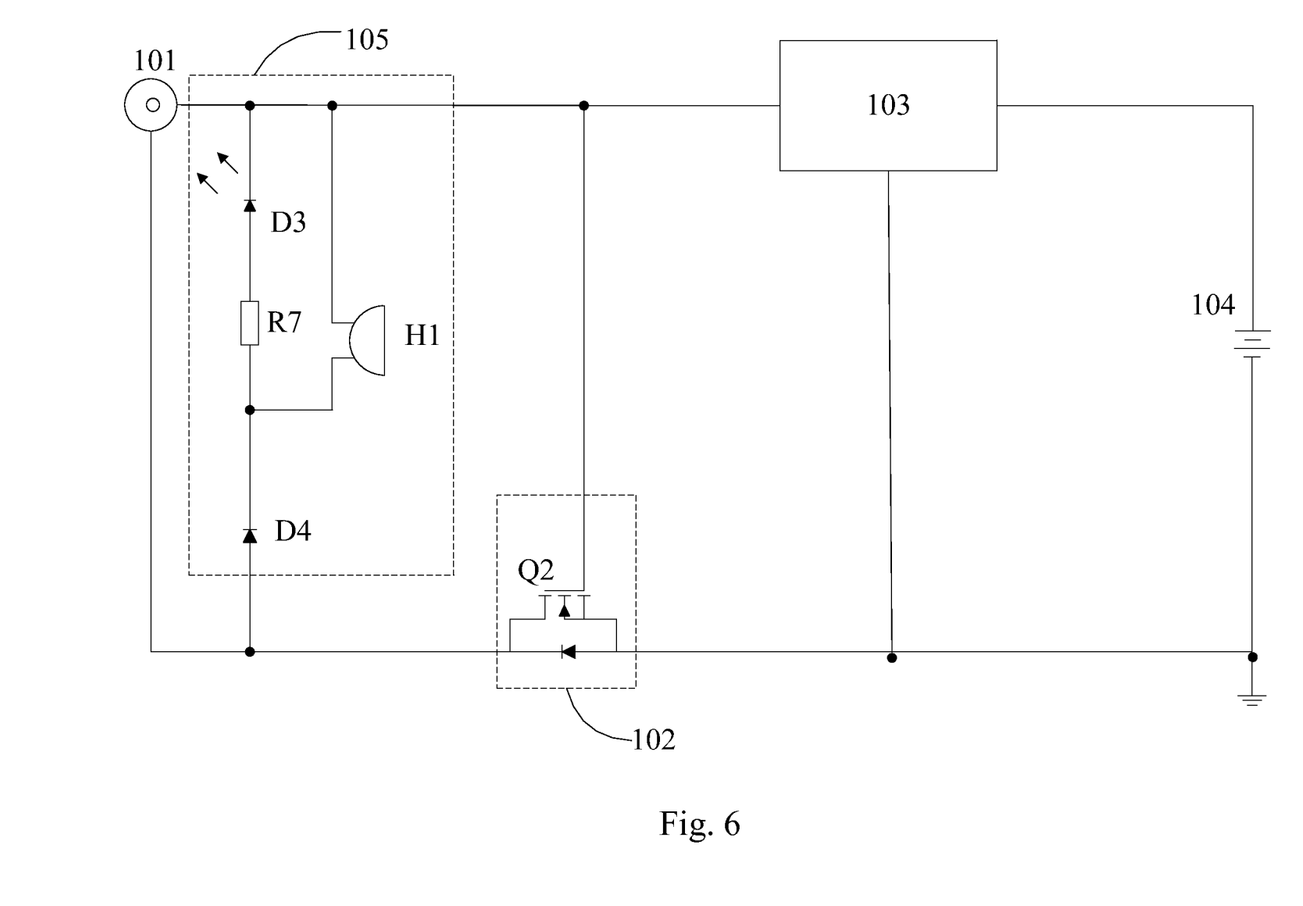
FIG. 6 is a circuit diagram of a circuit for preventing charging power supply from reversely connecting according to a forth embodiment of the present invention.

FIG. 6 shows a circuit diagram of a circuit for preventing charging power supply from reversely connecting according to a forth embodiment of the present invention. In the forth embodiment of the invention, the charging circuit includes: a direct current input terminal 101, an unit for preventing charging power supply from reversely connecting 102 electrically connected with the direct current input terminal 101, a charge management unit 103 electrically connected with the unit for preventing charging power supply from reversely connecting 102, a rechargeable battery 104 electrically connected with the charge management unit 103 and a reminding circuit for reversal connection 105 electrically connected with the direct current input terminal 101. The reminding circuit for reversal connection 105 is configured to output a reminding message when the direct current input terminal 101 inputs the reverse direct current. The reminding message includes sound alarming and/or light alarming.

As shown in FIG. 6, in the forth embodiment of the invention, the unit for preventing charging power supply from reversely connecting 102 and the charge management unit 103 are the same as that in the first embodiment, and are not described again herein.

In the forth embodiment, the reminding circuit for reversal connection 105 includes a light emitting diode D3, current limiting resistance R7 and a first diode D4 and a buzzer H1.

The cathode of the light emitting diode D3 is connected to the anode of the direct current input terminal 101, and the anode thereof is connected to the cathode of the first diode D4 through the current limiting resistance R7. Wherein the anode of the first diode D4 is connected to the cathode of the direct current input terminal 101. One end of the buzzer H1 is connected to one end of the current limiting resistance R7 and the cathode of the first diode D4, the other end thereof is connected to the anode of the direct current input terminal 101 and the cathode of the light emitting diode D3.

In the forth embodiment, when the outer charging power supply is connected normally, a diode D4 is cutoff and the light emitting diode D3 and the buzzer H1 stop working. When the outer charging power supply is connected reversely, the diode D4 is conductive and the light emitting diode D3 and the buzzer H1 work to output a reminding message.

In the forth embodiment, be means of adding the reminding circuit for reversal connection 105, the light emitting diode D3 and/or the buzzer H1 can remind users when the outer charging power supply is connected reversely. In such case, users can discover the problem immediately.

Additionally, the reminding circuit for reversal connection 105 also can only includes a light emitting diode D3, current limiting resistance R7 and a diode D4. When the outer charging power supply is connected reversely, the light emitting diode D3 also can remind users and make the users discover the problem immediately.

Figure 7:
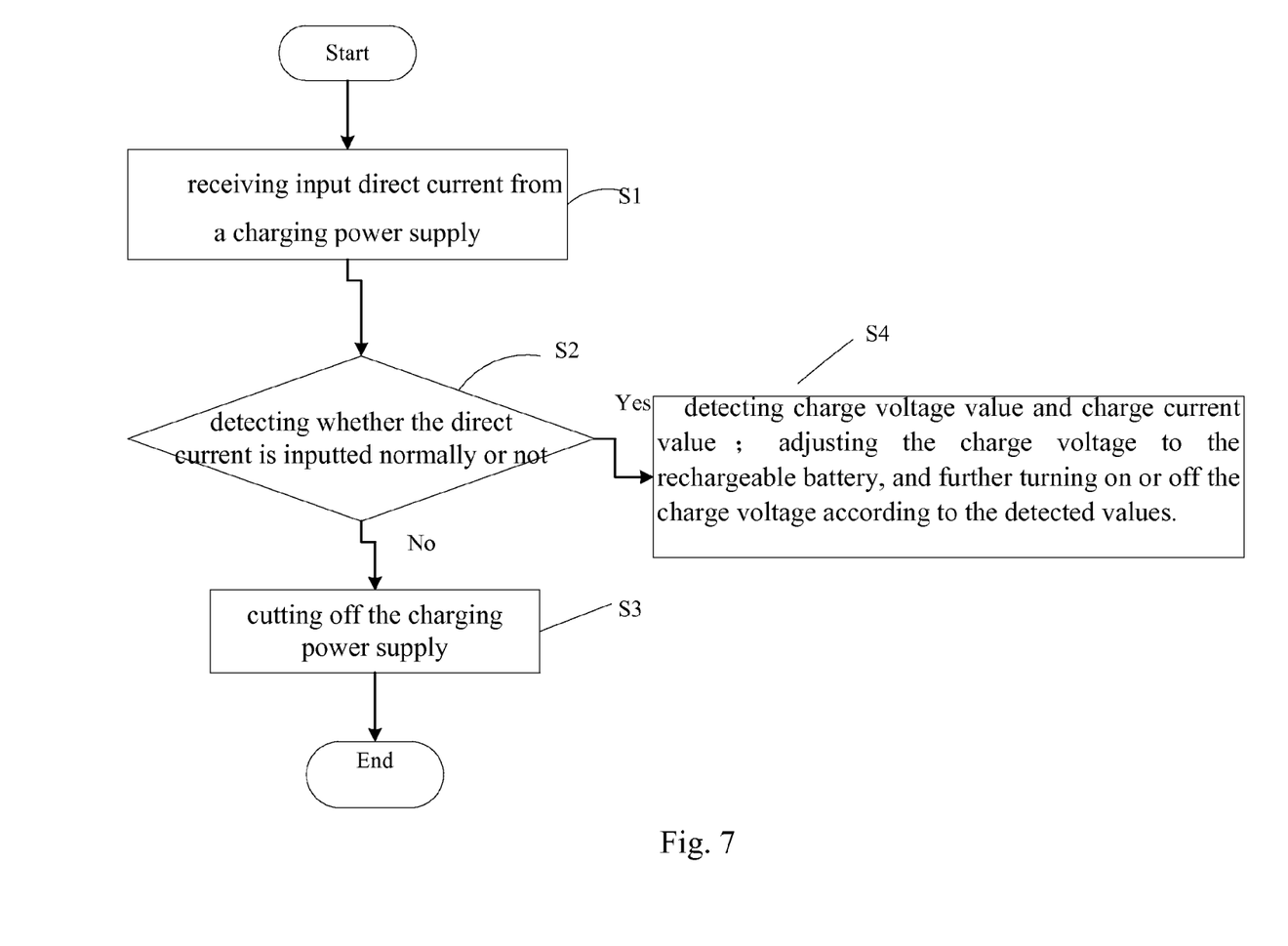
FIG. 7 is a flow chart of a method for preventing charging power supply from reversely connecting according to an embodiment of the present invention.

FIG. 7 shows a flow chart of a method for preventing charging power supply from reversely connecting according to an embodiment of the present invention. A method for preventing a reversal connection for charging power supply applied in an electronic cigarette or electronic cigarette case comprising a rechargeable battery, comprises:

S1. Receiving input direct current from a charging power supply;

S2. Detecting whether the direct current is inputted normally or not, if the direct current is inputted reversely, executing S3; if the direct current is normal, executing S4;

S3. cutting off the charging power supply;

S4. detecting charge voltage value and charge current value, adjusting the charge voltage to the rechargeable battery, and further turning on or off the charge to the rechargeable battery according to the detected values.

During the step S4 if one of the detected values exceeds a preset value, turning off the charge voltage to protect the charging circuit.

The method for preventing a reversal connection for charging power supply further includes: outputting the reminding message while the direct current is reverse; wherein the reminding message includes sound alarming and/or light alarming.

The charging circuit and method according to these embodiments of the invention can effectively prevent the risk of the electronic cigarette or the electronic cigarette case caused by the reverse connection of the charging power supply; it also has the advantages such as low voltage drop and low power consumption.

In the embodiment of the invention, it should be understood that a microcontroller chip with functions of AD converter and PWM output can be served as the microcontroller U1.

While the present invention has been described by reference to preferred embodiments, it will be understood by those skilled in the art that various changes may be made and equivalents may be substituted without departing from the scope of the present invention. However, all the changes will be included within the scope of the appended claims.

What is claimed is:

1. A charging circuit for preventing charging power supply from reversely connecting applied in an electronic cigarette or electronic cigarette case, comprising:
a direct current input terminal,
an unit for preventing charging power supply from reversely connecting electrically with the direct current input terminal,
a charge management unit electrically connected to the unit for preventing charging power supply from reversely connecting and a rechargeable battery electrically connected with the charge management unit;
wherein the direct current input terminal is configured to receive an input direct current from a charging power supply;

wherein the unit for preventing charging power supply from reversely connecting is configured to prevent the direct current input terminal from supplying a reverse direct current for the rechargeable battery, wherein when the direct current input terminal supplies the reverse direct current, the unit for preventing charging power supply from reversely connecting is turned off so that the charging power supply to the rechargeable battery is cut off;

when the direct current input terminal supplies a normal direct current, the unit for preventing charging power supply from reversely connecting is turned on so that the direct current from the direct current input terminal flows into the charge management unit via the unit for preventing charging power supply from reversely connecting;

wherein the charge management unit is configured to detect charge voltage value and charge current value when the unit for preventing charging power supply from reversely connecting is turned on, to adjust the charged voltage to the rechargeable battery, and further to turn on or off the charge voltage according to detected result;

wherein the unit for preventing charging power supply from reversely connecting comprises a first MOSFET, and the first MOSFET is a P channel MOSFET;

a drain of the first MOSFET is connected to an anode of the direct current input terminal directly;

a source of the first MOSFET is connected to the charge management unit directly; and a gate of the first MOSFET is connected to a cathode of the rechargeable battery through a sixth resistor and connected to a cathode of the direct current input terminal directly.

2. The charging circuit of claim 1, wherein the charge management unit comprises:
a voltage regulating unit;
a control unit; and
a detection unit;
wherein the voltage regulating unit is connected to the control unit, the unit for preventing charging power supply from reversely connecting and the rechargeable battery respectively; the control unit is connected to the detection unit; the detection unit is connected to the rechargeable battery and the voltage regulating unit;

wherein when the unit for preventing charging power supply from reversely connecting is turned on, the detection unit detects the charge voltage value and charge current value; and the control unit controls the voltage regulating unit turning on or off the charge voltage to the rechargeable battery, and further controls the voltage regulating unit adjusting the charged voltage to the charging battery according to the detected voltage and current values.

3. The charging circuit of claim 2, wherein the control unit includes a microcontroller, wherein the microcontroller comprises a $V_{DD}$ terminal, a $V_{SS}$ terminal, a pulse signal output terminal, a first input terminal and a second input terminal;

wherein the voltage regulating unit includes a first triode, a second triode, a first resistor, a second resistor, a third resistor, a first inductor, a first capacitor and a fly-wheel diode;

wherein the detection unit includes a fourth resistor, a fifth resistor and the sixth resistor;

wherein the $V_{DD}$ terminal of the microcontroller is connected to the source of the first MOSFET and an emitter of the second triode; the $V_{SS}$ terminal is connected to ground;

a base of the first triode is connected to the pulse signal output terminal through the first resistor, an emitter of the first triode is connected to the ground; and a collector of the first triode is connected to a base of the second triode through the third resistor and further coupled with the emitter of the second triode and the source of the first MOSFET through the third resistor and second resistor that are connected in series;

wherein the emitter of the second triode is connected to the source of the first MOSFET; a collector of the second triode is connected to a cathode of the fly-wheel diode and further coupled with an anode of the rechargeable battery through the first inductor;

an anode of the fly-wheel diode is connected to the ground; one end of the first capacitor is connected to one end of the first inductor and the anode of the rechargeable battery, the other end of the first capacitor is connected to the ground;

wherein one end of the fourth resistor is connected to one end of the first inductor and the anode of the rechargeable battery, and the other end is connected to the fifth resistor and the first input terminal of the microcontroller;

wherein one end of the fifth resistor is connected to the fourth resistor and the first input terminal of the microcontroller, and the other end is connected to the ground;

wherein one end of the sixth resistor is connected to the second input terminal of the microcontroller and the cathode of the rechargeable battery, and the other end is connected with the ground.

4. The charging circuit of claim 1, wherein the charging circuit further includes: a reminding circuit for reverse connection electrically connected with the direct current input, which is configured to output a reminding message when the direct current input terminal inputs the reverse direct current.

5. The charging circuit of claim 4, wherein, the reminding circuit for reversal connection includes a light emitting diode, a current limiting resistor and a first diode;
wherein a cathode of the light emitting diode is connected to the anode of the direct current input terminal, and an anode of the light emitting diode is connected to a cathode of the first diode through the current limiting resistor;
wherein an anode of the first diode is connected to the cathode of the direct current input terminal.

6. The charging circuit of claim 5, wherein the reminding circuit for reversal connection further includes a buzzer;
one end of the buzzer is connected to one end of the current limiting resistor and the cathode of the first diode, the other end is connected to the anode of the direct current input terminal and the cathode of the light emitting diode.

7. A charging circuit for preventing charging power supply from reversely connecting applied in an electronic cigarette or electronic cigarette case, comprising:
a direct current input terminal,
an unit for preventing charging power supply from reversely connecting electrically with the direct current input terminal,
a charge management unit electrically connected to the unit for preventing charging power supply from reversely connecting and a rechargeable battery electrically connected with the charge management unit;

wherein the direct current input terminal is configured to receive an input direct current from a charging power supply;

wherein the unit for preventing charging power supply from reversely connecting is configured to prevent the direct current input terminal from supplying a reverse direct current for the rechargeable battery, wherein when the direct current input terminal supplies the reverse direct current, the unit for preventing charging power supply from reversely connecting is turned off so that the charging power supply to the rechargeable battery is cut off;

when the direct current input terminal supplies a normal direct current, the unit for preventing charging power supply from reversely connecting is turned on so that the direct current from the direct current input terminal flows into the charge management unit via the unit for preventing charging power supply from reversely connecting;

wherein the charge management unit is configured to detect charge voltage value and charge current value when the unit for preventing charging power supply from reversely connecting is turned on, to adjust the charged voltage to the rechargeable battery, and further to turn on or off the charge voltage according to detected result;

wherein the unit for preventing charging power supply from reversely connecting comprises a second MOSFET, wherein the second MOSFET is an N channel MOSFET;

a drain of the second MOSFET is connected to a cathode of the direct current input terminal;

a source of the second MOSFET is connected to a cathode of the rechargeable battery through a sixth resistor; and a gate of the second MOSFET is connected to an anode of the direct current input terminal as well as the charge management unit.

8. The charging circuit of claim 7, wherein the charge management unit includes: a voltage-regulating unit, a control unit and a detection unit;

wherein the voltage regulating unit is connected to the control unit, the unit for preventing charging power supply from reversely connecting and the rechargeable battery respectively; the control unit is connected to the detection unit; the detection unit is connected to the rechargeable battery and the voltage regulating unit;

wherein when the unit for preventing charging power supply from reversely connecting is turned on, the detection unit detects the charge voltage value and charge current value; and the control unit controls the voltage regulating unit turning on or off the charge voltage to the rechargeable battery, and further controls the voltage regulating unit to adjust the charged voltage to the rechargeable battery according to the detected voltage and current values.

9. The charging circuit of claim 8, wherein the control unit includes a microcontroller, wherein the microcontroller comprises a $V_{DD}$ terminal, a $V_{SS}$ terminal, a pulse signal output terminal, a first input terminal and a second input terminal;

wherein the voltage regulating unit includes a first triode, a second triode, a first resistor, a second resistor, a third resistor, a first inductor, a first capacitor and a fly-wheel diode;

wherein the detection unit includes a fourth resistor, a fifth resistor and the sixth resistor;

wherein the $V_{DD}$ terminal of the microcontroller is connected to the gate of the second MOSFET and an emitter of the second triode; the $V_{SS}$ terminal is connected to ground;

a base of the first triode is connected to the pulse signal output terminal through the first resistor;

an emitter of the first triode is connected to the ground; and a collector of the first triode is connected to a base of the second triode through the third resistor and further connected to the emitter of the second triode and the gate of the second MOSFET through the third resistor and second resistor that are connected in series;

wherein the emitter of the second triode is connected to the gate of the second MOSFET;

a collector of the second triode is connected to a cathode of the fly-wheel diode and further connected with an anode of the rechargeable battery through the first inductor;

an anode of the fly-wheel diode is connected to the ground; one end of the first capacitor is connected to one end of the first inductor and the anode of the rechargeable battery, the other end of the first capacitor is connected to the ground;

wherein one end of the fourth resistor is connected to one end of the first inductor and the anode of the rechargeable battery, and the other end is connected to the fifth resistor and the first input terminal of the microcontroller;

wherein one end of the fifth resistor is connected to the fourth resistor and the first input terminal of the microcontroller, and the other end is connected to the ground;

wherein one end of the sixth resistor is connected to the second input terminal of the microcontroller and the cathode of the rechargeable battery, and the other end is connected with the ground.

10. The charging circuit of claim 7, wherein the charging circuit further includes: a reminding circuit for reversal connection electrically connected with the direct current input, which is configured to output reminding message when the direct current input terminal inputs the reverse direct current.

11. The charging circuit of claim 10, wherein the reminding circuit for reversal connection includes a light emitting diode, a current limiting resistor and a first diode;

wherein a cathode of the light emitting diode is connected to the anode of the direct current input terminal, and an anode of the light emitting diode is connected to a cathode of the first diode through the current limiting resistor;

wherein an anode of the first diode is connected to the cathode of the direct current input terminal.

12. The charging circuit of claim 11, wherein the reminding circuit for reversal connection further includes a buzzer;

wherein, one end of the buzzer is connected to one end of the current limiting resistor and the cathode of the first diode, the other end is connected to the anode of the direct current input terminal and the cathode of the light emitting diode.

* * * * *